(12) United States Patent
Senshu et al.

(10) Patent No.: US 11,924,968 B2
(45) Date of Patent: Mar. 5, 2024

(54) LAYERED BODY AND ELECTRONIC COMPONENT

(71) Applicant: Murata Manufacturing Co., Ltd., Kyoto (JP)

(72) Inventors: Yutaka Senshu, Kyoto (JP); Yasutaka Sugimoto, Kyoto (JP); Sadaaki Sakamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 124 days.

(21) Appl. No.: 17/351,633

(22) Filed: Jun. 18, 2021

(65) Prior Publication Data

US 2021/0315100 A1 Oct. 7, 2021

Related U.S. Application Data

(63) Continuation of application No. PCT/JP2019/049302, filed on Dec. 17, 2019.

(30) Foreign Application Priority Data

Dec. 21, 2018 (JP) ................................. 2018-239605

(51) Int. Cl.
*H05K 1/03* (2006.01)
*B32B 18/00* (2006.01)
(Continued)

(52) U.S. Cl.
CPC ........... *H05K 1/0306* (2013.01); *B32B 18/00* (2013.01); *H05K 1/115* (2013.01); *B32B 37/06* (2013.01);
(Continued)

(58) Field of Classification Search
CPC ................ H05K 1/0306; H05K 1/115; H05K 2201/10015; H05K 2201/1003;
(Continued)

(56) References Cited

U.S. PATENT DOCUMENTS 6,413,620 B1 7/2002 Kimura et al.
2006/0108049 A1* 5/2006 Wang .................... H01L 21/481
428/210
(Continued)

FOREIGN PATENT DOCUMENTS

JP 2001-185824 A 7/2001
JP 2002-047059 A 2/2002
(Continued)

OTHER PUBLICATIONS

JP2008-0159981 English Translation (Year: 2008).*
(Continued)

*Primary Examiner* — Steven T Sawyer
(74) *Attorney, Agent, or Firm* — Pearne & Gordon LLP

(57) ABSTRACT

The laminate of the present disclosure is a laminate including multiple glass ceramic layers each containing quartz and a glass that contains $SiO_2$, $B_2O_3$, $Al_2O_3$, and $M_2O$, where M is an alkali metal. An $Al_2O_3$ content of a surface layer portion of the laminate is higher than an $Al_2O_3$ content of an inner layer portion of the laminate, and a $M_2O$ content of the surface layer portion is lower than a $M_2O$ content of the inner layer portion.

4 Claims, 1 Drawing Sheet

(51) Int. Cl.
*H05K 1/11* (2006.01)
*B32B 37/06* (2006.01)

(52) U.S. Cl.
CPC ..... *B32B 2305/77* (2013.01); *B32B 2307/732* (2013.01); *B32B 2315/02* (2013.01); *B32B 2457/08* (2013.01); *H05K 2201/10015* (2013.01); *H05K 2201/1003* (2013.01); *H05K 2201/1006* (2013.01)

(58) Field of Classification Search
CPC ........... H05K 2201/1006; H05K 1/162; H05K 1/165; H05K 1/181; H05K 3/4629; B32B 18/00; B32B 37/06; B32B 2305/77; B32B 2307/732; B32B 2315/02; B32B 2457/08; B32B 17/06; C03C 8/02; C03C 8/20; C03C 3/091
See application file for complete search history.

(56) References Cited

U.S. PATENT DOCUMENTS

| | | | | |
|---|---|---|---|---|
| 2006/0110602 | A1* | 5/2006 | Wang | C03C 14/004 428/432 |
| 2009/0294167 | A1* | 12/2009 | Nomiya | H05K 1/0271 174/262 |
| 2012/0003450 | A1* | 1/2012 | Motoya | C04B 35/195 428/213 |
| 2015/0037552 | A1* | 2/2015 | Mauro | C03C 3/091 501/65 |
| 2017/0240460 | A1* | 8/2017 | Boek | B32B 7/027 |
| 2018/0072627 | A1* | 3/2018 | Kato | C04B 35/2633 |
| 2018/0319129 | A1 | 11/2018 | Sakamoto et al. | |
| 2019/0069396 | A1* | 2/2019 | Oka | H05K 1/0306 |
| 2019/0233323 | A1* | 8/2019 | Ogino | C03C 4/00 |
| 2022/0080702 | A1* | 3/2022 | Murakami | B29C 70/30 |

FOREIGN PATENT DOCUMENTS

| | | |
|---|---|---|
| JP | 2002-187768 A | 7/2002 |
| JP | 2008-159981 A | 7/2008 |
| WO | 2017/002434 A1 | 1/2017 |
| WO | 2017/122381 A1 | 7/2017 |

OTHER PUBLICATIONS

International Search Report for International Patent Application No. PCT/JP2019/049302 dated Mar. 10, 2020.
Written Opinion for International Patent Application No. PCT/JP2019/049302 dated Mar. 10, 2020.

* cited by examiner

LAYERED BODY AND ELECTRONIC COMPONENT

CROSS REFERENCE TO RELATED APPLICATIONS

This is a continuation of International Application No. PCT/JP2019/049302 filed on Dec. 17, 2019 which claims priority from Japanese Patent Application No. 2018-239605 filed on Dec. 21, 2018. The contents of these applications are incorporated herein by reference in their entireties.

BACKGROUND OF THE DISCLOSURE

Field of the Disclosure

The present disclosure relates to laminates and electronic components.

Description of the Related Art

Use of a laminate including multiple glass ceramic layers as an electronic component is known.

Patent Literature 1 discloses a dielectric material that has a low relative permittivity and a low dielectric loss, that is fireable at a temperature of 1000° C. or lower, and that is usable as a radio high frequency circuit component. The dielectric material contains 50 to 90% borosilicate glass that contains, in percent mass and in oxide equivalent, 70 to 85% $SiO_2$, 10 to 25% $B_2O_3$, 0.5 to 5% $K_2O$, and 0.01 to 1% $Al_2O_3$ and 10 to 50% $SiO_2$ fillers that are one or more kinds of fillers selected from α-quartz, α-cristobalite, and β-tridymite.

Patent Literature 2 discloses a laminate having high strength and low permittivity. The laminate includes a multilayer structure including a surface layer portion and an inner layer portion, wherein the surface layer portion and the inner layer portion each contain glass and quartz, the glass contained in each of the surface layer portion and the inner layer portion contains $SiO_2$, $B_2O_3$, and $M_2O$, where M is an alkali metal, and the quartz content of the surface layer portion is lower than the quartz content of the inner layer portion. Adding $M_2O$ in a small amount (0.1 to 10%) is considered to reduce the viscosity of glass and to enable the presence of much $SiO_2$, and therefore to be effective in reducing the permittivity. Further, a preferred amount of $Al_2O_3$ in the glass seems to be 0.1 to 5%.

Patent Literature 1: JP 2002-187768 A
Patent Literature 2: WO 2017/122381

BRIEF SUMMARY OF THE DISCLOSURE

In the case of using a ceramic laminate as a circuit board, the ceramic laminate needs to have chemical durability that can prevent corrosion in steps such as washing and plating. It also needs to work under a high-temperature and high-humidity environment after components are mounted thereon. Corrosion during these procedures may cause disadvantages such as cracking, which results in reduced strength, and reduced insulation reliability. Borosilicate glass commonly has higher chemical durability when it contains more $Al_2O_3$ and less $M_2O$, where M is an alkali metal.

The dielectric material disclosed in Patent Literature 1 is limited to have an $Al_2O_3$ content of less than 1% so as to have a low permittivity, and thus has low chemical durability.

The laminate disclosed in Patent Literature 2 can have a higher $Al_2O_3$ content than the one in Patent Literature 1, so that it has higher chemical durability. However, a laminate with much higher chemical durability is awaited.

The present disclosure is made to solve the above issues and aims to provide a laminate having high chemical durability.

The laminate of the present disclosure includes multiple glass ceramic layers each containing quartz and a glass that contains $SiO_2$, $B_2O_3$, $Al_2O_3$, and $M_2O$, where M is an alkali metal, an $Al_2O_3$ content of a surface layer portion of the laminate being higher than an $Al_2O_3$ content of an inner layer portion of the laminate, and a $M_2O$ content of the surface layer portion being lower than a $M_2O$ content of the inner layer portion.

An electronic component of the present disclosure includes a multilayer ceramic substrate including the laminate of the present disclosure and a chip component mounted on the multilayer ceramic substrate.

The present disclosure can provide a laminate having high chemical durability.

DETAILED DESCRIPTION OF THE DISCLOSURE

The laminate and electronic component of the present disclosure are described hereinbelow. However, the present disclosure is not limited to the following structures and may be suitably modified without departing from the gist of the present disclosure. Combinations of two or more preferred structures of the present disclosure described in the following are also within the scope of the present disclosure.

Figure 1:
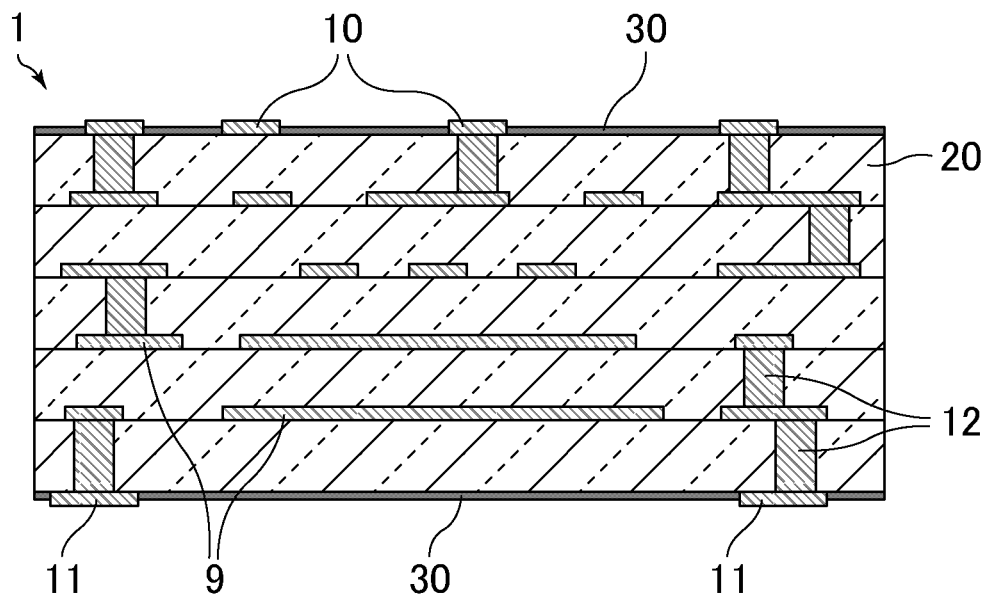
FIG. 1 is a schematic cross-sectional view of an example of a laminate.

First, the laminate of the present disclosure is described. FIG. 1 is a schematic cross-sectional view of an example of the laminate. A laminate 1 is a laminate including multiple glass ceramic layers 20 stacked. The laminate 1 includes an internal electrode. The internal electrode includes conductive films 9, 10, and 11 and via hole conductors 12. Conductive lines are used to constitute passive elements, such as capacitors or inductors, or to serve as connection lines to provide electrical connection between the elements. The internal electrode is preferably formed from a material containing Ag or Cu. An internal electrode formed from Ag or Cu is preferred because it is fireable at the sintering temperature of glass ceramic.

The conductive films 9 are provided inside the laminate 1. The conductive films 10 and 11 are provided respectively on a first main surface and a second main surface of the laminate 1. Each via hole conductor 12 is provided such that it is electrically connected to any of the conductive films 9, 10, and 11 and it penetrates any of the glass ceramic layers 20 in the thickness direction.

Each of the main surfaces of the laminate 1 is provided with a surface layer portion 30. The surface layer portion 30 is a portion having a high $Al_2O_3$ content and a low $M_2O$ (wherein M is an alkali metal) content. The structure of the surface layer portion 30 will be specifically described later.

The first main surface of the laminate 1 may be provided with a chip component (not illustrated) in the state of being electrically connected with the conductive film 10. The conductive film 11 on the second main surface of the laminate 1 is used as an electrical connector during mounting the chip-mounted laminate on a motherboard that is not illustrated.

Each glass ceramic layer in the laminate of the present disclosure contains quartz and a glass that contains $SiO_2$, $B_2O_3$, $Al_2O_3$, and $M_2O$, where M is an alkali metal.

The glass preferably has a $SiO_2$ content of 75% by weight or more, more preferably 80% by weight or more. An increased $SiO_2$ content can lead to a reduced permittivity of the laminate. A higher $SiO_2$ content may cause high viscosity and significantly low sinterability. Thus, the $SiO_2$ content is preferably 95% by weight or less, more preferably 90% by weight or less.

To achieve improved solubility, the glass preferably has a $B_2O_3$ content of 5% by weight or more, more preferably 10% by weight or more. To reduce evaporation and more effectively reduce phase separation, the $B_2O_3$ content is preferably 30% by weight or less, more preferably 25% by weight or less, still more preferably 20% by weight or less. Occurrence of the phase separation mentioned herein reduces the chemical durability of the laminate. The phase separation will be specifically described later.

To give increased chemical durability and more effectively reduce phase separation, the glass preferably has an $Al_2O_3$ content of 0.1% by weight or more, more preferably 0.2% by weight or more, still more preferably 0.5% by weight or more. A higher $Al_2O_3$ content may cause an increased viscosity and reduced sinterability. Thus, the $Al_2O_3$ content is preferably 3% by weight or less, more preferably 2% by weight or less, still more preferably 1.5% by weight or less.

$M_2O$ in the glass contributes to improvement of the solubility. $M_2O$ may be of any type that is an alkali metal oxide, and is preferably any of $Li_2O$, $K_2O$, and $Na_2O$, more preferably $K_2O$. $M_2O$ may include one alkali metal oxide or may include two or more alkali metal oxides. In the case of using two or more alkali metal oxides as $M_2O$, the sum of the amounts thereof is defined as the $M_2O$ content. The glass preferably has a $M_2O$ content of 0.2% by weight or more, more preferably 0.5% by weight or more, still more preferably 1.0% by weight or more. To give a reduced permittivity and increased chemical durability, the $M_2O$ content is preferably 5% by weight or less, more preferably 3% by weight or less, still more preferably 2% by weight or less.

The glass contained in each glass ceramic layer may further contain an alkaline earth metal oxide such as CaO. The glass may further contain other impurities. The amount of impurities, when contained, is preferably less than 5% by weight.

To ensure the fluidity during sintering, the proportion of the glass in each glass ceramic layer is preferably 65% by weight or more, more preferably 70% by weight or more, still more preferably 75% by weight or more. A higher proportion of the glass may prevent degreasing, and thus the proportion of the glass is preferably 85% by weight or less, more preferably 80% by weight or less.

Each glass ceramic layer contains quartz in addition to the glass. Quartz is added as a filler. In addition to quartz, any of $Al_2O_3$ filler, $ZrO_2$ filler, and amorphous silica may be added as a filler. The filler as used herein means an inorganic additive not included in the glass. Each glass ceramic layer preferably has a filler content of 15% by weight or more, preferably 20% by weight or more. The filler content is also preferably 35% by weight or less, more preferably 30% by weight or less, still more preferably 25% by weight or less.

When a glass having a high $SiO_2$ proportion in each glass ceramic layer is used together with quartz, it is possible to provide the laminate with a low permittivity. The relative permittivity may be reduced to 4.5 or lower, for example. This is because both $SiO_2$ contained in the glass and quartz are materials having a relative permittivity of 4.5 or lower.

In the laminate of the present disclosure, the $Al_2O_3$ content of the surface layer portion of the laminate is higher than the $Al_2O_3$ content of the inner layer portion of the laminate, while the $M_2O$ content of the surface layer portion is lower than the $M_2O$ content of the inner layer portion. The $Al_2O_3$ content of the laminate can be determined by component analysis relative to the distance from a surface of the laminate by means of the secondary ion mass spectrometry (SIMS) to measure the weight proportion of $Al_2O_3$. As with the $Al_2O_3$ content, the $M_2O$ content can be determined by component analysis relative to the distance from a surface of the laminate by means of the secondary ion mass spectrometry (SIMS) to measure the weight proportion of $M_2O$. The measurement points for the $Al_2O_3$ content and the $M_2O$ content are preferably taken at 250 sites or more at intervals of 0.04 μm.

Figure 2:
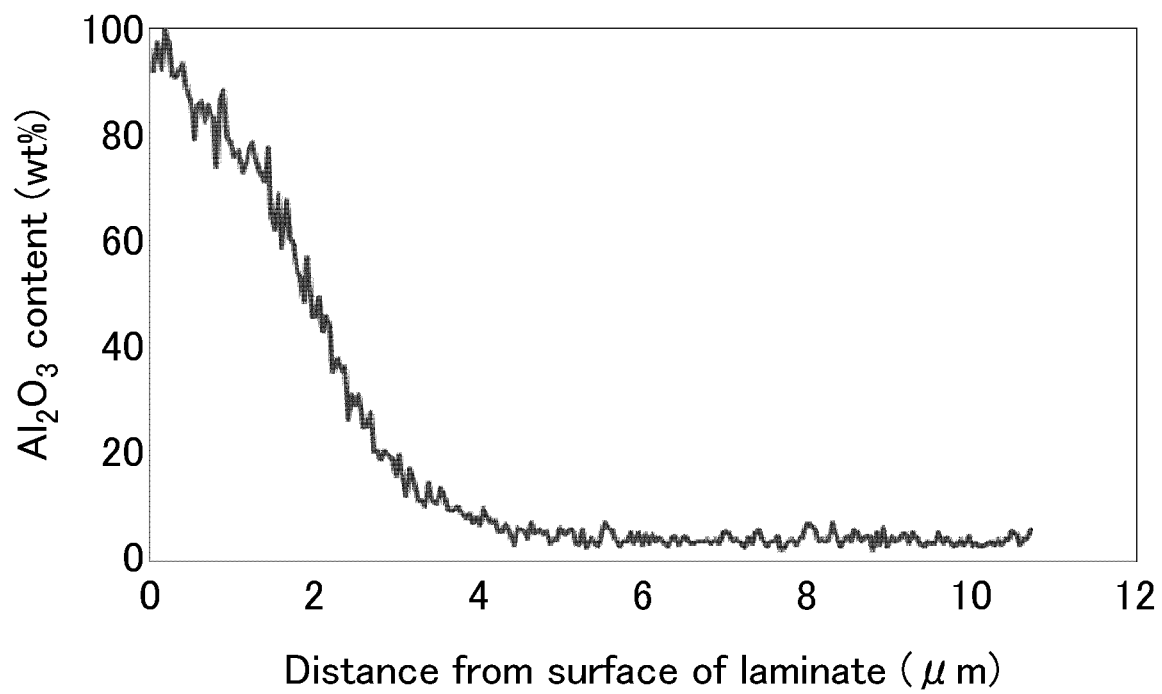
FIG. 2 is a graph of an example of the $Al_2O_3$ content relative to the distance from a surface of the laminate.

FIG. 2 is a graph of an example of the $Al_2O_3$ content relative to the distance from a surface of the laminate. FIG. 2 shows that the $Al_2O_3$ content is higher at a portion closer to a surface of the laminate. The figure also shows that the $Al_2O_3$ content becomes lower as the distance from the surface of the laminate becomes greater, and finally becomes a constant value.

No graph is provided for the $M_2O$ content. Typically, in contrast to the graph of the $Al_2O_3$ content, the $M_2O$ content is lower at a portion closer to a surface of the laminate. Also, the $M_2O$ content is higher as the distance from the surface of the laminate is greater, and finally becomes a constant value at the point where the $Al_2O_3$ content becomes a constant value.

As shown in FIG. 2, a region where the $Al_2O_3$ content measured becomes a constant value is defined as the inner layer portion, while a region where the $Al_2O_3$ content is higher than that in the inner layer portion is defined as the surface layer portion. Although the laminate has a feature such that the $M_2O$ content of the surface layer portion is lower than the $M_2O$ content of the inner layer portion, the position of the surface layer portion is defined by measurement of the $Al_2O_3$ content.

The surface layer portion may have any thickness in the laminate of the present disclosure. The $Al_2O_3$ content and $M_2O$ content at a position 2 μm apart from the surface of the laminate may be used as representative values for the $Al_2O_3$ content and $M_2O$ content of the surface layer portion of the laminate. The $Al_2O_3$ content is low while the $M_2O$ content is high at the center of the thickness direction of the laminate. Thus, the $Al_2O_3$ content and $M_2O$ content at the central point of the thickness direction of the laminate may be used as representative values for the $Al_2O_3$ content and $M_2O$ content of the inner layer portion of the laminate.

The "surface layer" and "inner layer" in the definitions described above have no relation to the positions of the respective glass ceramic layers constituting the laminate of the present disclosure. The boundary between the surface layer portion and the inner layer portion needs not to match the boundary of glass ceramic layers.

A high $Al_2O_3$ content of the surface layer portion of the laminate allows the laminate to have improved chemical durability. The chemical durability means water resistance and acid resistance. A small amount of alkali metal ions and divalent or higher ions dissolved when the laminate reacts with water or an acidic solution is regarded as indicating high chemical durability. Examples of the type of acid to be used for evaluation of acid resistance include hydrochloric acid, sulfuric acid, and nitric acid. The laminate preferably has acid resistance to an acidic solution having a pH of 1 or higher and 4 or lower.

Borosilicate glass is known to be phase-separated into (a) a $SiO_2$-rich phase and (b) a $B_2O_3$- and $M_2O$-rich phase after stored for a long period of time at high temperature. The $B_2O_3$- and $M_2O$-rich phase (b) among these has low chemical durability. When the glass surface reacts with water, $M_2O$ is selectively dissolved from the phase (b). Adding $Al_2O_3$ is considered to be effective for prevention of such phase separation. The same effect can be achieved by adding $Al_2O_3$ to the glass matrix. However, this addition significantly increases the viscosity of the glass to inhibit sintering. In contrast, increasing the $Al_2O_3$ content of the surface layer portion of the laminate causes no inhibition of sintering. For the laminate of the present disclosure, the surface layer portion is allowed to have a specifically increased $Al_2O_3$ content, which can lead to a higher effect of preventing $M_2O$ dissolution.

The surface layer portion of the laminate has a high $Al_2O_3$ content. The presence of this surface layer portion can lead to a specifically high effect against borosilicate glass having a low permittivity. Alumino-borosilicate glass, which is widely used for LTCC in conventional cases, has high water resistance, and thus the presence of a surface layer portion having a high $Al_2O_3$ content leads to a limited effect against such alumino-borosilicate glass.

To reduce the relative permittivity of glass, the content of $Al_2O_3$ needs to be reduced while the contents of $SiO_2$ and $B_2O_3$ need to be increased in the glass itself. However, this easily causes phase separation to reduce the chemical durability. Thus, preferably, the surface layer portion of the laminate has an increased $Al_2O_3$ content for enhanced chemical durability, while the inner layer portion of the laminate has a reduced $Al_2O_3$ content for reduced relative permittivity. Accordingly, an increased $Al_2O_3$ content of the surface layer portion can lead to a laminate having a low permittivity with borosilicate glass used as a base material.

The surface layer portion preferably has a thickness of 2 μm or greater. A surface layer portion having a thickness of smaller than 2 μm may allow ions such as alkali metal ions to easily pass through the surface layer portion and to move toward the surface of the laminate, which may cause a failure in achieving an effect of well improving the chemical durability. The thickness of the surface layer portion is preferably 20 μm or smaller. A surface layer portion having a thickness of greater than 20 μm may have a coefficient of expansion that is greatly different from that of the inner layer portion, which may possibly cause easy cracking during cooling and resultantly low strength. The thickness of the surface layer portion is more preferably 15 μm or smaller, still more preferably 10 μm or smaller.

The $Al_2O_3$ content of the surface layer portion is preferably 5% by weight or more, more preferably 10% by weight or more, still more preferably 20% by weight or more, particularly preferably 40% by weight or more. The $M_2O$ content of the surface layer portion is preferably 1% by weight or less, more preferably 0.5% by weight or less, still more preferably 0.2% by weight or less, particularly preferably 0.1% by weight or less. For the $Al_2O_3$ content and $M_2O$ content of the surface layer portion, the $Al_2O_3$ content and $M_2O$ content at a position 2 μm apart from the surface of the laminate are defined as representative values. A surface layer portion having an $Al_2O_3$ content of 5% by weight or more and a $M_2O$ content of 1% by weight or less can lead to more improved chemical durability and a more reduced amount of ions dissolved from the laminate into water or acid, for example.

The glass contained in the surface layer portion and the glass contained in the inner layer portion may have the same composition or different compositions excluding the $Al_2O_3$ content and the $M_2O$ content. However, they preferably have the same composition.

To reduce the transmission loss, the laminate preferably has a relative permittivity (measured at 3 GHz) of 4.5 or lower. The relative permittivity of the laminate can be measured by the perturbation method.

The laminate of the present disclosure may be used as a multilayer ceramic substrate. The multilayer ceramic substrate may be provided with a chip component. Mounting a chip component can provide an electronic component provided with a multilayer ceramic substrate. The electronic component of the present disclosure includes a multilayer ceramic substrate that includes the laminate of the present disclosure and a chip component mounted on the multilayer ceramic substrate.

The laminate of the present disclosure may be applied not only to the aforementioned multilayer ceramic substrate but also a chip component to be mounted on a multilayer ceramic substrate. Examples of the chip component include LC combined components such as LC filters, as well as capacitors and inductors. The laminate of the present disclosure may be applied to those other than the aforementioned multilayer ceramic substrate and chip component.

Next, a method for producing the laminate of the present disclosure is described below. The surface layer portion may be provided by any of a plurality of methods. Thus, the steps other than the methods of providing the surface layer portion are first described, and then the methods for providing the surface layer portion are described.

(1) Stacking

A glass powder containing $SiO_2$, $B_2O_3$, $Al_2O_3$, and $M_2O$, where M is an alkali metal, a quartz powder, and components such as a binder and a plasticizer are mixed to prepare ceramic slurry. The slurry is formed into sheets and dried, whereby glass ceramic green sheets are obtained. A glass ceramic green sheet to be provided with an internal electrode, among the glass ceramic green sheets, is provided with an internal electrode pattern by screen printing or photolithography using conductive paste. The conductive paste used is preferably a conductive paste containing Ag or Cu. These glass ceramic green sheets are stacked in multiple layers and press-bonded by, for example, hydrostatic pressing, whereby a multilayer green sheet is formed.

(2) Firing

The multilayer green sheet is fired and the glass ceramic green sheets are converted to glass ceramic layers, whereby a laminate is produced. The firing temperature is a temperature at which the glass ceramic green sheets are sinterable. For example, firing is preferably performed at 900° C. or higher and 1000° C. or lower for 30 minutes or longer and 90 minutes or shorter. The firing atmosphere may be either an air atmosphere or a reduced atmosphere.

These steps can provide a laminate. Steps of providing a surface layer portion during these steps are described below.

(i) Method of Using Constraining Layer

In the stacking, a constraining layer containing $Al_2O_3$ is placed on upper and lower surfaces of the multilayer green sheet. Each constraining layer preferably contains $Al_2O_3$ in an amount of 100% by weight (impurities are allowed). The constraining layers containing $Al_2O_3$ are sheets that are substantially unsinterable at a temperature at which the glass ceramic green sheets are sinterable. The constraining layers are to be substantially unsintered during firing and therefore do not shrink. Thus, the constraining layers act to reduce shrinkage of the laminate in the main-surface direction. This results in an increased dimensional accuracy of the internal electrode provided for the laminate.

In the case of using the constraining layers, $Al_2O_3$ in each constraining layer reacts with the glass component on the respective surface of the multilayer green sheet during firing to form a thin reaction layer on the surface of the laminate. This reaction layer contains a large amount of $Al_2O_3$ while contains small amounts of other components. Thus, the reaction layer serves as a surface layer portion having a high $Al_2O_3$ content and a low $M_2O$ content. In the case of using the constraining layers, firing is performed at a temperature at which the glass ceramic green sheets are sinterable but the constraining layers are unsinterable, and the constraining layers are removed from the fired laminate by treatment such as sandblasting. Removal of the constraining layers is performed to the extent that the surface layer portions remain.

(ii) Method of Using Glass Ceramic Green Sheets Having High $Al_2O_3$ Content in Glass The glass ceramic green sheets prepared are each a glass ceramic green sheet for a surface layer portion with the glass powder having a high $Al_2O_3$ content and a low $M_2O$ content. The glass ceramic green sheet for a surface layer portion is placed on the respective surface of a multilayer green sheet, followed by firing to provide a laminate. Each glass ceramic layer, which is the glass ceramic green sheet for a surface layer portion, serves as a surface layer portion having a high $Al_2O_3$ content and a low $M_2O$ content. Multiple types of sheets having different $Al_2O_3$ content in the respective glass powders may be produced and the sheets may be arranged such that the $Al_2O_3$ content changes stepwise from the surface layer portions.

(iii) Method of Using Glass Ceramic Green Sheets Having High $Al_2O_3$ Filler Content The glass ceramic green sheets prepared are each a glass ceramic green sheet for a surface layer portion in which the glass powder contains a high $Al_2O_3$ filler content. Adding a large amount of $Al_2O_3$ filler results in small proportions of other components. This can therefore lead to glass ceramic green sheets each having a low $M_2O$ content. The glass ceramic green sheet for a surface layer portion is placed on the respective surface of a multilayer green sheet, followed by firing to provide a laminate. Each glass ceramic layer, which is the glass ceramic green sheet for a surface layer portion, serves as a surface layer portion having a high $Al_2O_3$ content and a low $M_2O$ content. Multiple types of sheets having different $Al_2O_3$ filler content may be produced and the sheets may be arranged such that the $Al_2O_3$ content changes stepwise from the surface layer portions.

(iv) Method of Forming $Al_2O_3$ Films on Fired Laminate $Al_2O_3$ films are physically formed on the respective surfaces of a fired laminate. The $Al_2O_3$ films may be formed using a sputtering device, but the forming method is not limited thereto. The $M_2O$ content in each $Al_2O_3$ film is lower than the $M_2O$ content in the glass ceramic layers of the inner layer portion. Thus, each $Al_2O_3$ film serves as a surface layer portion having a high $Al_2O_3$ content and a low $M_2O$ content.

EXAMPLES

The following provides examples that more specifically disclose the laminate of the present disclosure. The present disclosure is not limited to these examples.

Preparation of Samples Under Standard Conditions

Glasses having the respective glass compositions shown in Table 1 were prepared, melted, cooled, and pulverized to have a particle size d50=1 μm. Each of these glasses was mixed with a variety of fillers (each having a particle size d50=1 μm), i.e., $SiO_2$ (quartz and amorphous silica), $Al_2O_3$, and $ZrO_2$, so as to achieve the sheet composition as shown in Table 1. Ethanol and a dispersant were added to form slurry, and the slurry was pulverized for 16 hours using $5-mm rounded stones. A binder and a plasticizer (dioctyl phthalate, DOP) were further added and mixed again for four hours. The resulting slurry was applied to a PET film by a doctor blade method and dried at 40° C., whereby a glass ceramic green sheet having a thickness of 50 μm was produced. This green sheet was cut into pieces each having a predetermined size. Ten layers of the cut green sheets were stacked and press-bonded, whereby a multilayer green sheet was produced. An electric furnace was used to fire the multilayer green sheet in the air atmosphere at 990° C. for 30 minutes, whereby a laminate was produced. These conditions are referred to as the standard conditions hereinbelow. For the glass compositions and sheet compositions of Nos. 1 to 9, Nos. 1 to 4 correspond to Examples 1 to 4 and Nos. 5 to 9 correspond to Comparative Examples 1 to 5.

TABLE 1

| | Glass composition | | | | | Sheet composition | | | | |
|---|---|---|---|---|---|---|---|---|---|---|
| | | | | | | | | Amorphous | | |
| No. | $SiO_2$ (wt %) | $B_2O_3$ (wt %) | $K_2O$ (wt %) | $Al_2O_3$ (wt %) | | Glass (wt %) | Quartz (wt %) | silica (wt %) | $Al_2O_3$ (wt %) | $ZrO_2$ (wt %) |
| 1 | 84.0 | 14.0 | 1.5 | 0.5 | Inner layer | 76 | 20 | 0 | 3 | 1 |
| 2 | 85.5 | 12.5 | 1.2 | 0.8 | Inner layer | 72 | 22 | 1 | 4 | 1 |
| 3 | 84.5 | 13.5 | 0.8 | 1.2 | Inner layer | 78 | 18 | 0 | 3 | 1 |
| 4 | 79.0 | 18.8 | 2.0 | 0.2 | Inner layer | 70 | 22 | 4 | 3 | 1 |
| 5 | 84.0 | 14.0 | 1.5 | 0.5 | Inner layer | 76 | 20 | 0 | 3 | 1 |
| 6 | 80.0 | 12.0 | 5.5 | 2.5 | Surface layer | 70 | 6 | 14 | 3 | 1 |
| | | | | | Inner layer | 76 | 20 | 0 | 3 | 1 |
| 7 | 79.0 | 17.0 | 3.7 | 0.3 | Surface layer | 80 | 10 | 7 | 2 | 1 |
| | | | | | Inner layer | 76 | 20 | 0 | 3 | 1 |
| 8 | 82.0 | 13.3 | 4.5 | 0.2 | Inner layer | 100 | 0 | 0 | 0 | 0 |
| 9 | 77.3 | 19.0 | 2.9 | 0.8 | Inner layer | 100 | 0 | 0 | 0 | 0 |

Example 1: Formation of Surface Layer Portions Using Constraining Layers

Glass ceramic green sheets each containing $Al_2O_3$ as an inorganic component were stacked as constraining layers on the respective outermost layers of a multilayer green sheet, and the multilayer green sheet produced was then fired. Reaction layers each having a thickness of several micrometers remained on the respective surfaces of the laminate. Secondary ion mass spectrometry (SIMS) was performed to measure the $Al_2O_3$ content relative to the distance from a surface of the laminate. The results of SIMS confirmed that the reaction layers had a higher $Al_2O_3$ content than the inner layer portion and the $Al_2O_3$ content monotonously increased from the inner layer portion toward the surfaces of the laminate. FIG. 2 shows the results of measuring the $Al_2O_3$ content in the laminate of Example 1 relative to the distance from a surface of the laminate.

Examples 2 to 4: Formation of Surface Layer Portions by Different Method

In Example 2, a plurality of glass ceramic green sheets each having a thickness of 2 μm with the $Al_2O_3$ contents in the glasses being set to be gradually increased was stacked on each surface of a multilayer green sheet. The workpiece was then fired under the standard conditions. In this case, the laminate was such that the $Al_2O_3$ content changed stepwise from the surface layer portions. In Example 3, glass ceramic green sheets each having a thickness of 5 μm with an increased $Al_2O_3$ filler content were stacked on the respective surfaces of the multilayer green sheet. The workpiece was then fired under the standard conditions. In this case, the laminate was such that glass ceramic layers derived from the glass ceramic green sheets with an increased $Al_2O_3$ filler content served as the surface layer portions. In Example 4, firing was performed under the standard conditions to provide a laminate, and each surface of the laminate was then physically coated with an $Al_2O_3$ film having a thickness of 2 μm. In this case, the laminate was such that the $Al_2O_3$ films served as the surface layer portions.

Comparative Examples 1 to 5

In Comparative Examples 1, 4, and 5, laminates were produced under the standard conditions. In Comparative Examples 2 and 3, eight inner layer sheets were stacked and a surface layer sheet was placed on the front and back surfaces of this workpiece to provide a multilayer green sheet. The multilayer green sheet was then subjected to the steps from press-bonding to firing under the standard conditions.

Measurement of $Al_2O_3$ Content and $K_2O$ Content

The $Al_2O_3$ content and $K_2O$ content at a position 2 μm deep from a surface of each of the laminates produced in the examples and the comparative examples were measured by SIMS. The values were taken as the $Al_2O_3$ content and $K_2O$ content of each surface layer portion. The $Al_2O_3$ content and $K_2O$ content at the center of each of the laminates in the thickness direction were also measured by SIMS. The values were taken as the $Al_2O_3$ content and $K_2O$ content of the inner layer portion. The results are shown in Table 2.

Evaluation of Chemical Durability

One piece of each of the laminates produced in the examples and the comparative examples was immersed in 80° C. pure water for eight hours. The elements dissolved were quantified by ICP-MS. The target elements selected were Al, B, and K. Another piece of each of the laminates produced in the examples and the comparative examples was immersed in 45° C. hydrochloric acid having pH=2 for 60 minutes. The elements dissolved were quantified by the same method. The results are shown in Table 2.

TABLE 2

| | Surface layer portion | | Inner layer portion | | Treatment for | Amount of ion dissolved relative to water (μg/mL) | | | Amount of ion dissolved relative to acid (μg/mL) | | |
|---|---|---|---|---|---|---|---|---|---|---|---|
| | $K_2O$ (wt %) | $Al_2O_3$ (wt %) | $K_2O$ (wt %) | $Al_2O_3$ (wt %) | forming surface layer portion | Al | B | K | Al | B | K |
| Example 1 | 0.5 | 45.0 | 1.1 | 3.4 | Constraining layer | 0.007 | 0.05 | 0.10 | 0.06 | 0.02 | 0.09 |
| Example 2 | 0.4 | 17.0 | 0.9 | 4.6 | $Al_2O_3$-rich glass surface | 0.008 | 0.04 | 0.07 | 0.18 | 0.01 | 0.06 |
| Example 3 | 0.3 | 11.0 | 0.6 | 3.9 | $Al_2O_3$ filler-rich surface | 0.008 | 0.03 | 0.06 | 0.09 | 0.01 | 0.05 |
| Example 4 | 0.0 | 100.0 | 1.4 | 3.1 | $Al_2O_3$ coat surface | 0.006 | 0.01 | 0.01 | 0.04 | 0.01 | 0.01 |
| Comparative Example 1 | 1.3 | 3.2 | 1.1 | 3.4 | — | 0.012 | 0.08 | 0.19 | 0.30 | 0.03 | 0.17 |
| Comparative Example 2 | 4.0 | 4.6 | 4.2 | 4.9 | — | 0.015 | 0.06 | 0.65 | 0.53 | 0.02 | 0.61 |
| Comparative Example 3 | 3.2 | 2.0 | 2.8 | 3.2 | — | 0.010 | 0.10 | 0.57 | 0.18 | 0.03 | 0.55 |
| Comparative Example 4 | 4.7 | 0.1 | 4.5 | 0.2 | — | 0.003 | 0.04 | 1.02 | 0.02 | 0.01 | 0.96 |
| Comparative Example 5 | 3.1 | 0.7 | 2.9 | 0.8 | — | 0.007 | 0.15 | 0.73 | 0.05 | 0.04 | 0.68 |

In the laminates of Examples 1 to 4, each surface layer portion had a high $Al_2O_3$ content while having a low $K_2O$ content. Thus, ions in the surface layer portions of the laminate were chemically stable and dissolution of Al, B, and K ions was reduced. For Al ions, the laminates of Examples 1 to 4 had a better effect of reducing ion dissolution than the laminates of Comparative Examples 1 to 3. For B ions, the laminates of Examples 1 to 4 had a better effect of reducing ion dissolution than the laminates of Comparative Examples 1 to 3 and 5. For K ions, the laminates of Examples 1 to 4 had a better effect of reducing ion dissolution than the laminates of Comparative Examples 1 to 5. The laminates of Examples 1 to 4 had a good effect of reducing ion dissolution, especially for K ions having the highest ion mobility, and thus are regarded as having high chemical stability.

1: laminate
9, 10, 11: conductive film
12: via hole conductor
20: glass ceramic layer
30: surface layer portion

The invention claimed is:

1. A laminate comprising multiple glass ceramic layers each containing quartz and a glass, wherein the glass contains $SiO_2$, $B_2O_3$, $Al_2O_3$, and $M_2O$, and wherein $M_2O$ is at least one selected from the group consisting of $Li_2O$, $Na_2O$, and $K_2O$, wherein the laminate comprises an upper surface layer portion, a lower surface layer portion, and an inner layer portion sandwiched between the upper surface layer portion and the lower surface layer portion, and the inner layer portion comprises a plurality of layers laminated together, an $Al_2O_3$ content of the upper and lower surface layer portions being higher than an $Al_2O_3$ content of the inner layer portion, and a $M_2O$ content of the upper and lower surface layer portions being lower than a $M_2O$ content of the inner layer portion, each of the upper and lower surface layer portions having a thickness of 2 μm or greater and 6 μm or smaller.

2. The laminate according to claim 1,
wherein the upper and lower surface layer portions have an $Al_2O_3$ content of 5% by weight or more and an $M_2O$ content of 1% by weight or less.

3. An electronic component comprising:
a multilayer ceramic substrate including the laminate according to claim 1; and
a chip component mounted on the multilayer ceramic substrate.

4. An electronic component comprising:
a multilayer ceramic substrate including the laminate according to claim 2; and
a chip component mounted on the multilayer ceramic substrate.

* * * * *